United States Patent [19]

Dietrich et al.

[11] 4,236,436
[45] Dec. 2, 1980

[54] ELECTRONIC MUSIC SYNTHESIZER

[75] Inventors: Ralph N. Dietrich, Georgetown; John W. Robinson; Stephen L. Howell, both of Jasper, all of Ind.

[73] Assignee: Kimball International, Inc., Jasper, Ind.

[21] Appl. No.: 958,731

[22] Filed: Nov. 8, 1978

[51] Int. Cl.$^3$ .................. G10H 1/057; G10H 1/08; G10H 1/12

[52] U.S. Cl. .................. 84/1.26; 84/1.11; 84/1.13; 84/1.19; 84/1.23; 84/1.24; 84/DIG. 9; 84/DIG. 10; 84/DIG. 20

[58] Field of Search .................. 84/1.01, 1.03, 1.11, 84/1.12, 1.13, 1.19, 1.21, 1.24, 1.25, 1.26, DIG. 2, DIG. 9, DIG. 10, DIG. 11, DIG. 12, DIG. 20, 1.22, 1.23

[56] References Cited

U.S. PATENT DOCUMENTS

| | | | |
|---|---|---|---|
| 3,475,623 | 10/1969 | Moog | 307/233 |
| 3,530,225 | 9/1970 | Gschwandther | 84/1.13 |
| 3,534,144 | 10/1970 | Ring | 84/1.01 |
| 3,610,801 | 10/1971 | Fredkin et al. | 84/1.03 |
| 3,636,231 | 1/1972 | Schrecongost et al. | 84/1.13 |
| 3,665,089 | 5/1972 | Stearns | 84/1.01 |
| 3,733,955 | 5/1973 | Reinagel et al. | 84/1.01 |
| 3,787,601 | 1/1974 | Campbell | 84/1.24 |
| 3,801,721 | 4/1974 | Bunger | 84/DIG. 20 |
| 3,808,344 | 4/1974 | Ippolito | 84/1.01 |
| 3,833,750 | 9/1974 | Iorio | 84/1.03 |
| 3,898,905 | 8/1975 | Schreier | 84/DIG. 20 |
| 3,906,830 | 9/1975 | Mathias | 84/DIG. 20 |
| 3,924,505 | 12/1975 | Schrecongost | 84/1.26 |
| 3,930,429 | 1/1976 | Hill | 84/1.26 |
| 3,971,284 | 7/1976 | Schreier | 84/1.13 |
| 3,992,969 | 11/1976 | Robinson et al. | 84/1.11 |
| 3,992,973 | 11/1976 | Howell | 84/DIG. 11 |
| 4,016,792 | 4/1977 | Schrecongost | 84/DIG. 20 |
| 4,050,343 | 9/1977 | Moog | 84/1.26 |
| 4,063,484 | 12/1977 | Robinson | 84/1.24 |
| 4,106,383 | 8/1978 | Dittmar | 84/DIG. 12 |
| 4,106,384 | 8/1978 | Whittington et al. | 84/1.19 |
| 4,119,006 | 10/1978 | Whitefield | 84/1.13 |
| 4,147,083 | 4/1979 | Woron et al. | 84/1.01 |
| 4,163,407 | 8/1979 | Solender | 84/DIG. 12 |

OTHER PUBLICATIONS

D. Lancaster, "Pitch Generators for Electronic Music", Popular Electronics, Mar. 1974, pp. 50–53.

*Primary Examiner*—Stanley J. Witkowski
*Attorney, Agent, or Firm*—Albert L. Jeffers; John F. Hoffman

[57] ABSTRACT

An electronic music synthesizer capable of simulating a wide variety of musical effects, wherein the settings which create the various effects are hard wired on a plurality of selectable circuit boards so that programming of the instrument can be accomplished by the player with minimum effort. The synthesizer encodes a plurality of keys on the keyboard and selects a tone from the tone generator corresponding to the depressed key. This tone is fed through a chain of dividers to create the needed footages, which are then fed to voicing cards that create the different tone sources for the synthesizer. These tone sources are fed into a state variable active filter which modifies the timbre of the tone sources in order to achieve the desired frequency-related effects. The output of the filter is fed to a gain module wherein the amplitude envelope has a controlled attach and decay as well as several different modes of operation such as steady state and percussive, which are selected by means of multiple bit binary words produced at the preprogrammed circuit board. The operating frequency of the filter is controlled by an envelope generator preset in a percussive mode to have a predetermined envelope. All controls for the synthesizer are preset from the voice boards, which are individually connected in the circuit either by tab switch operation or by physically inserting the voice board in a player accessible connector.

23 Claims, 17 Drawing Figures

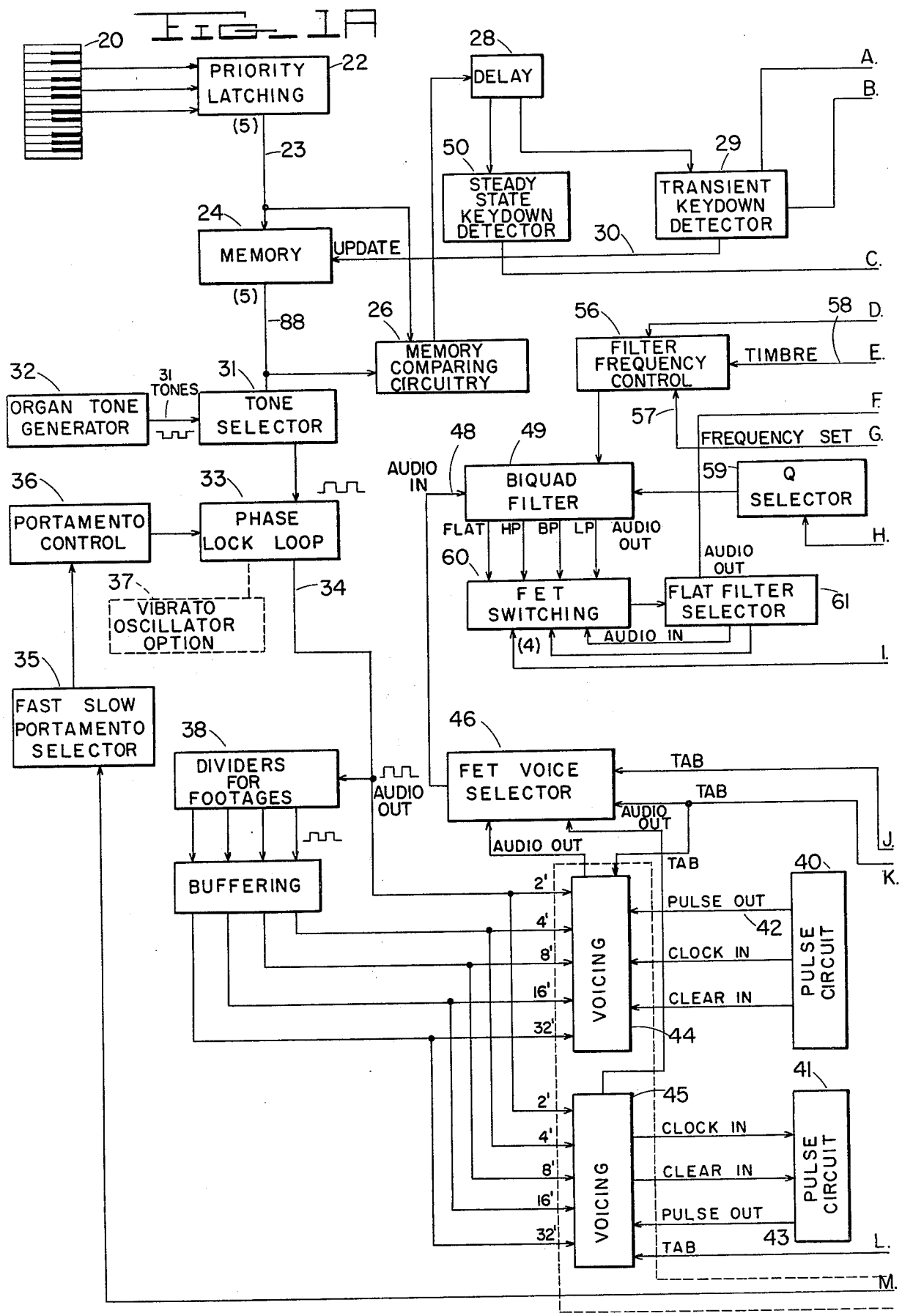

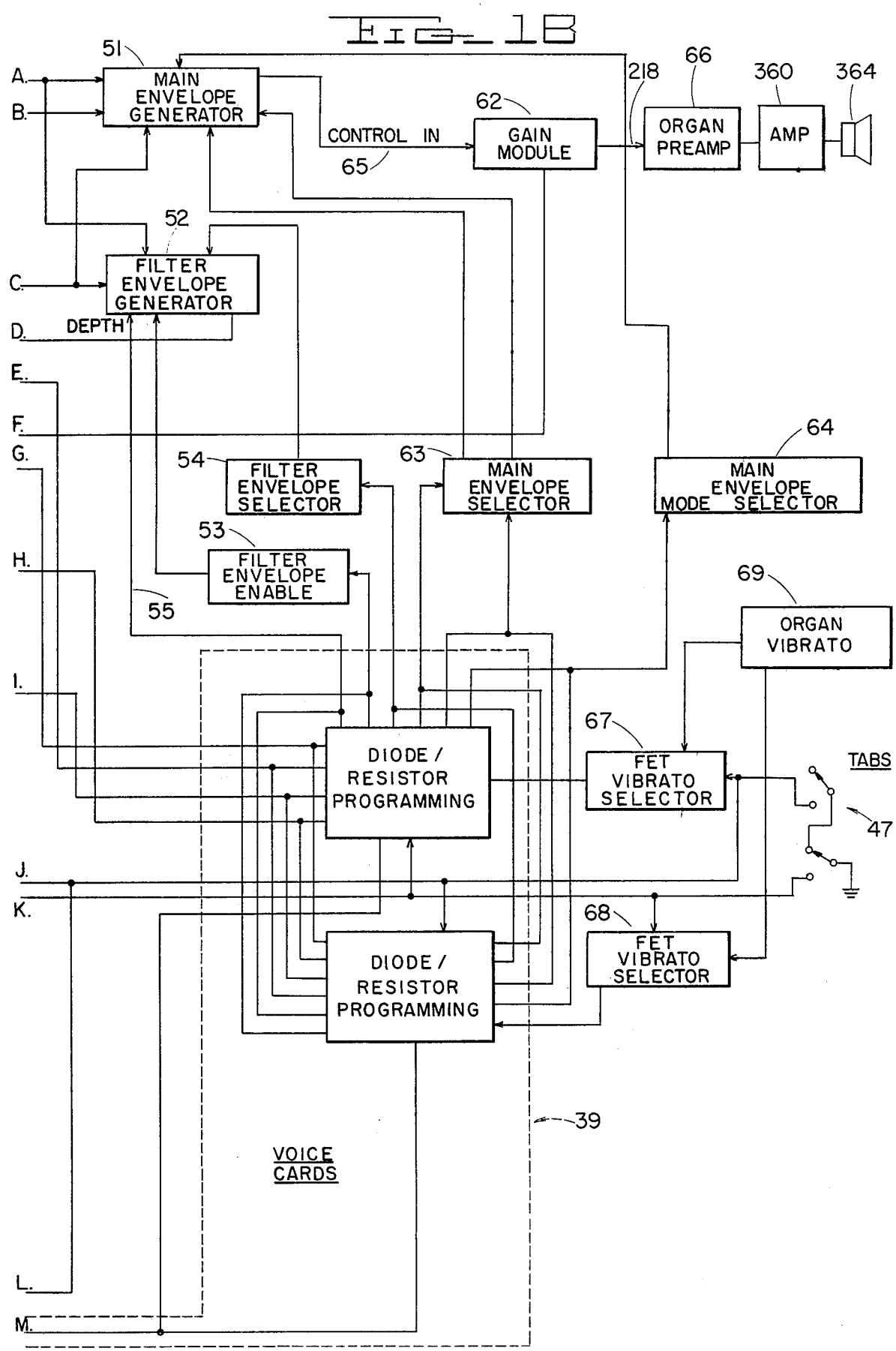

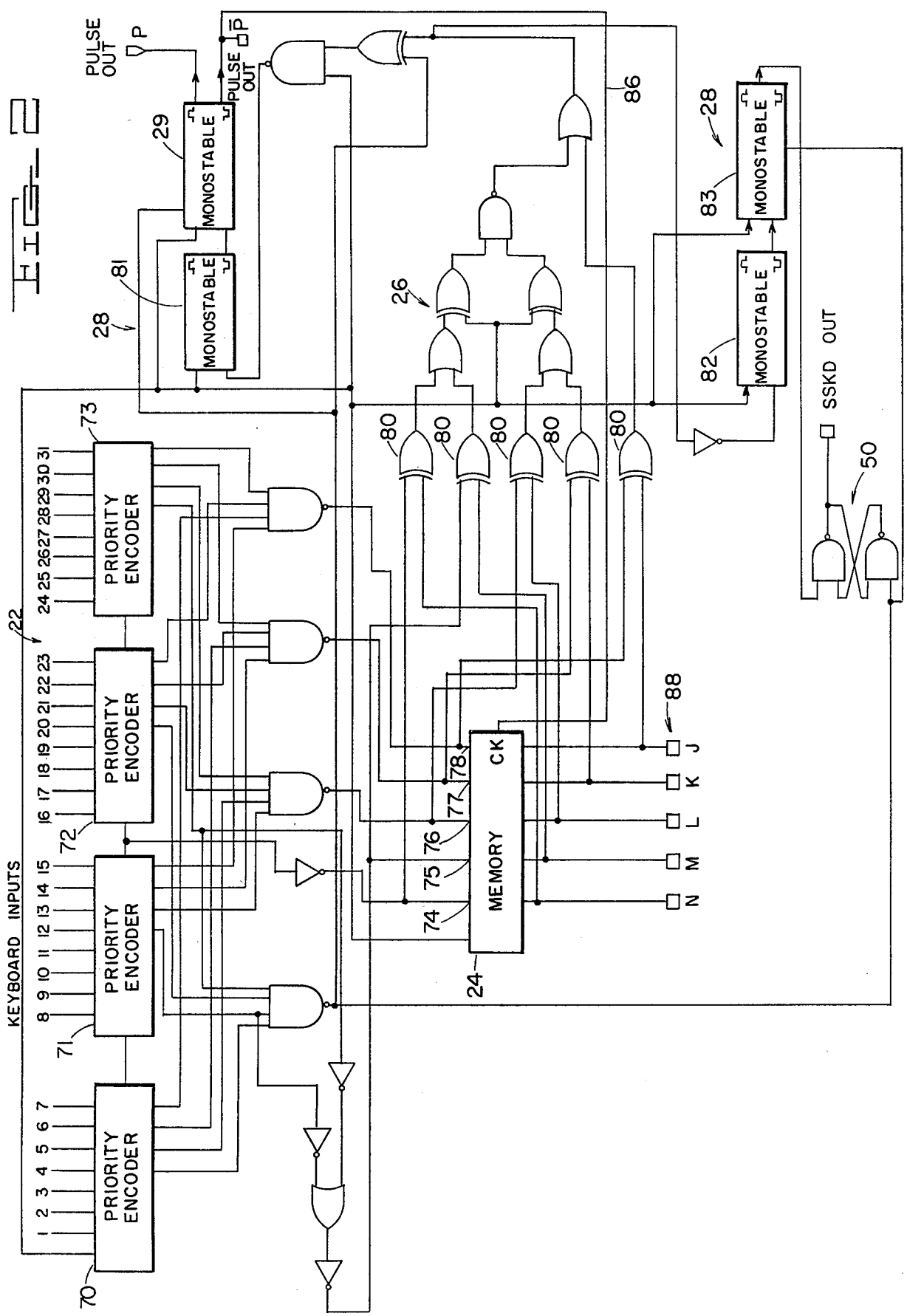

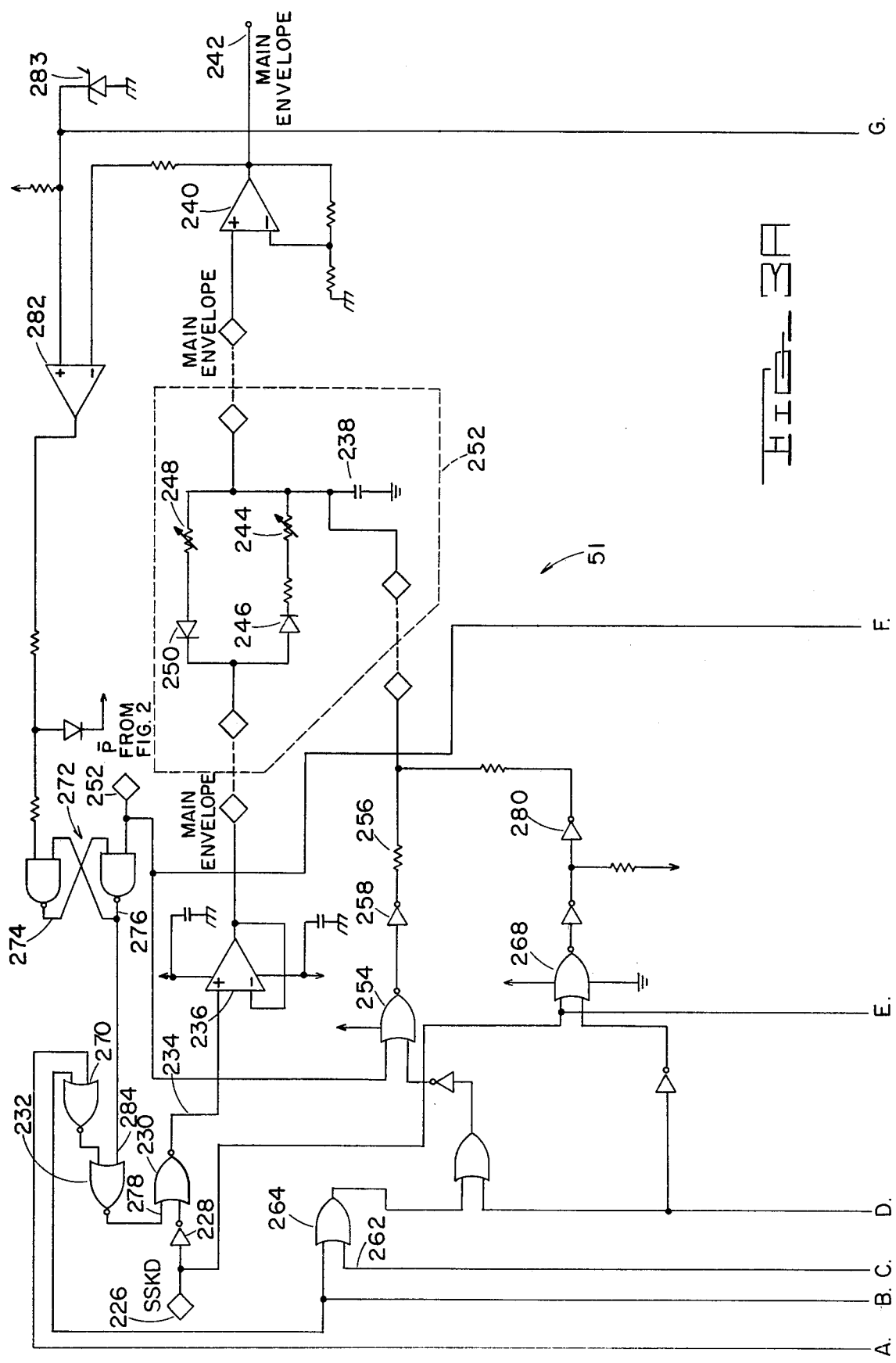

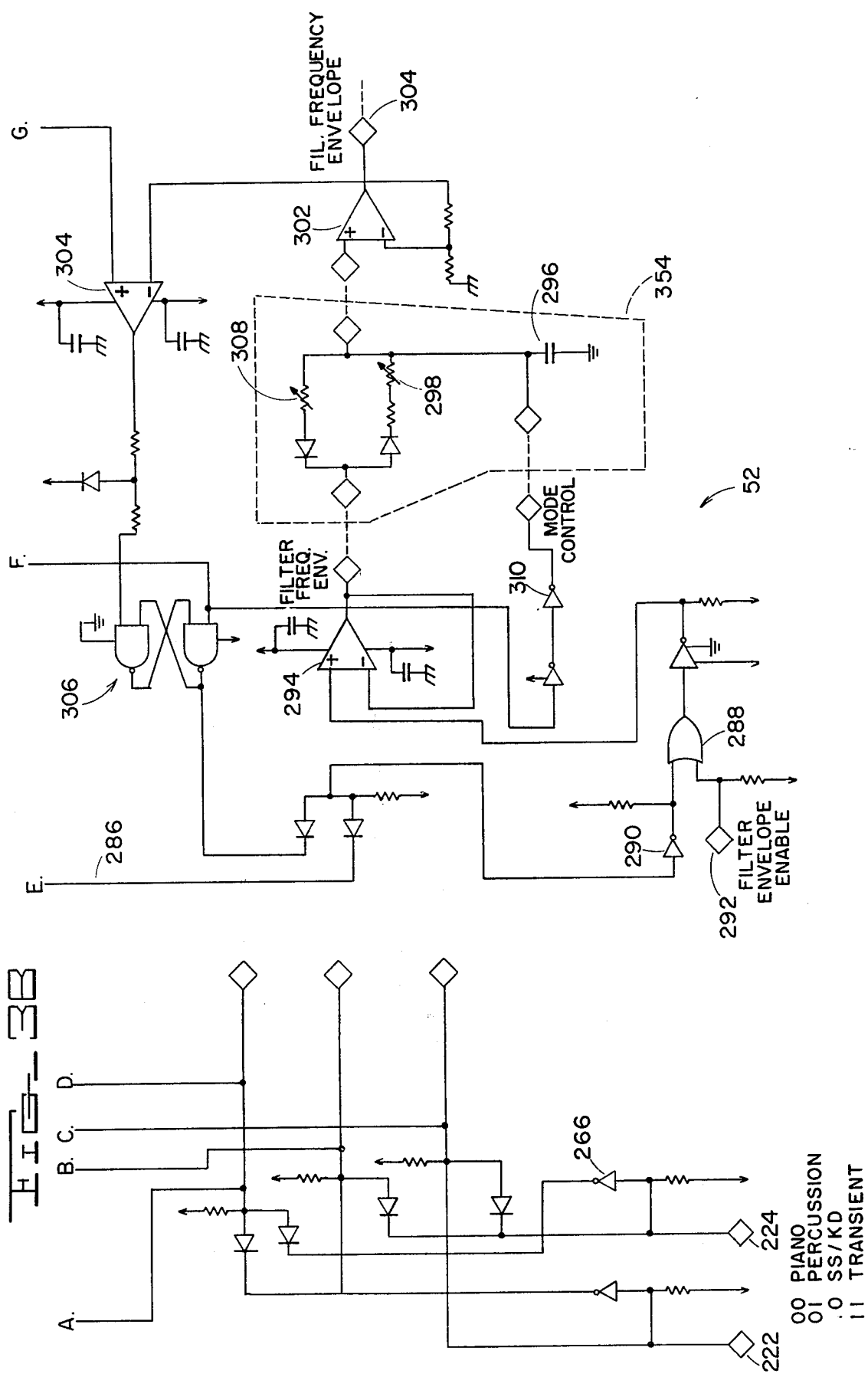

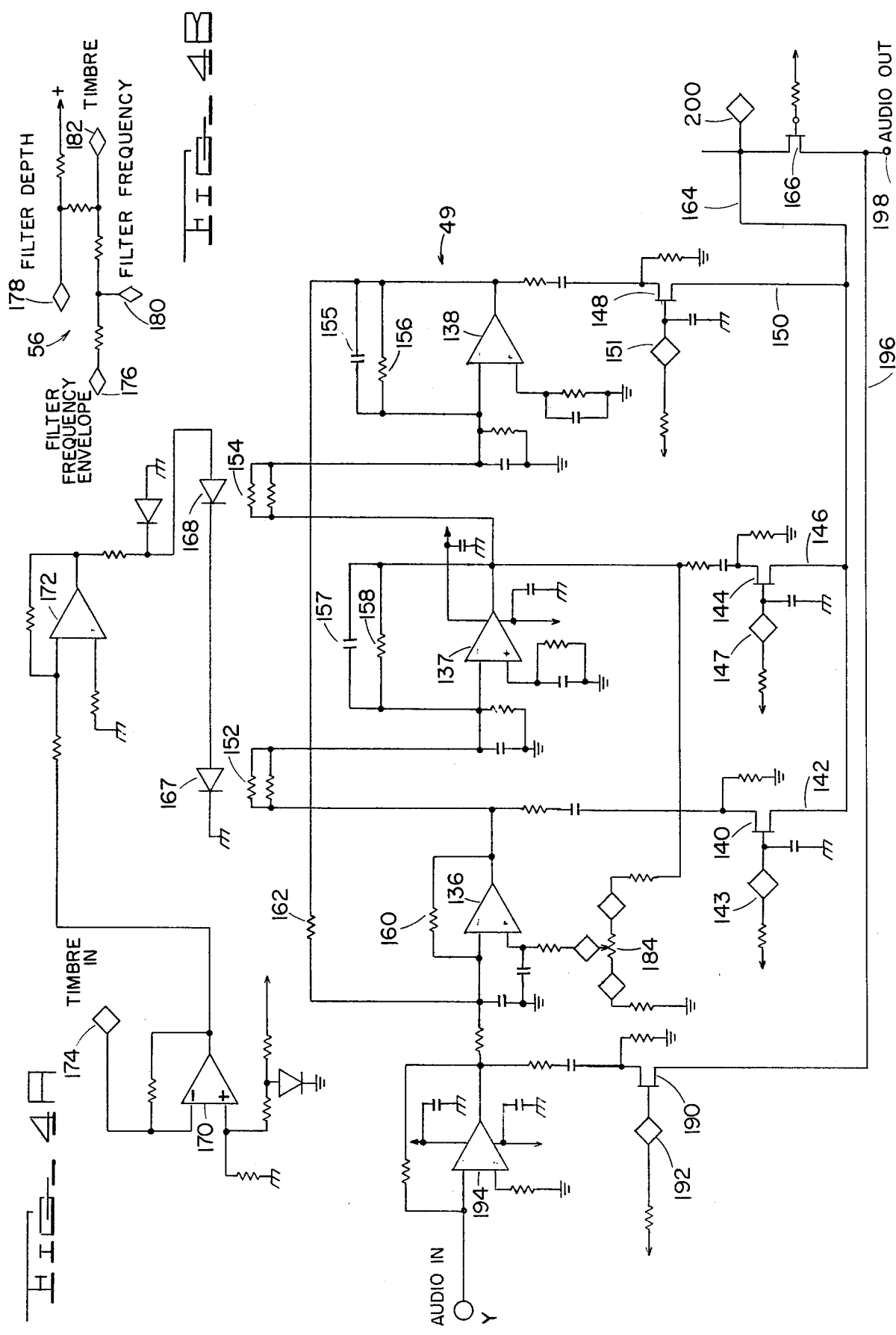

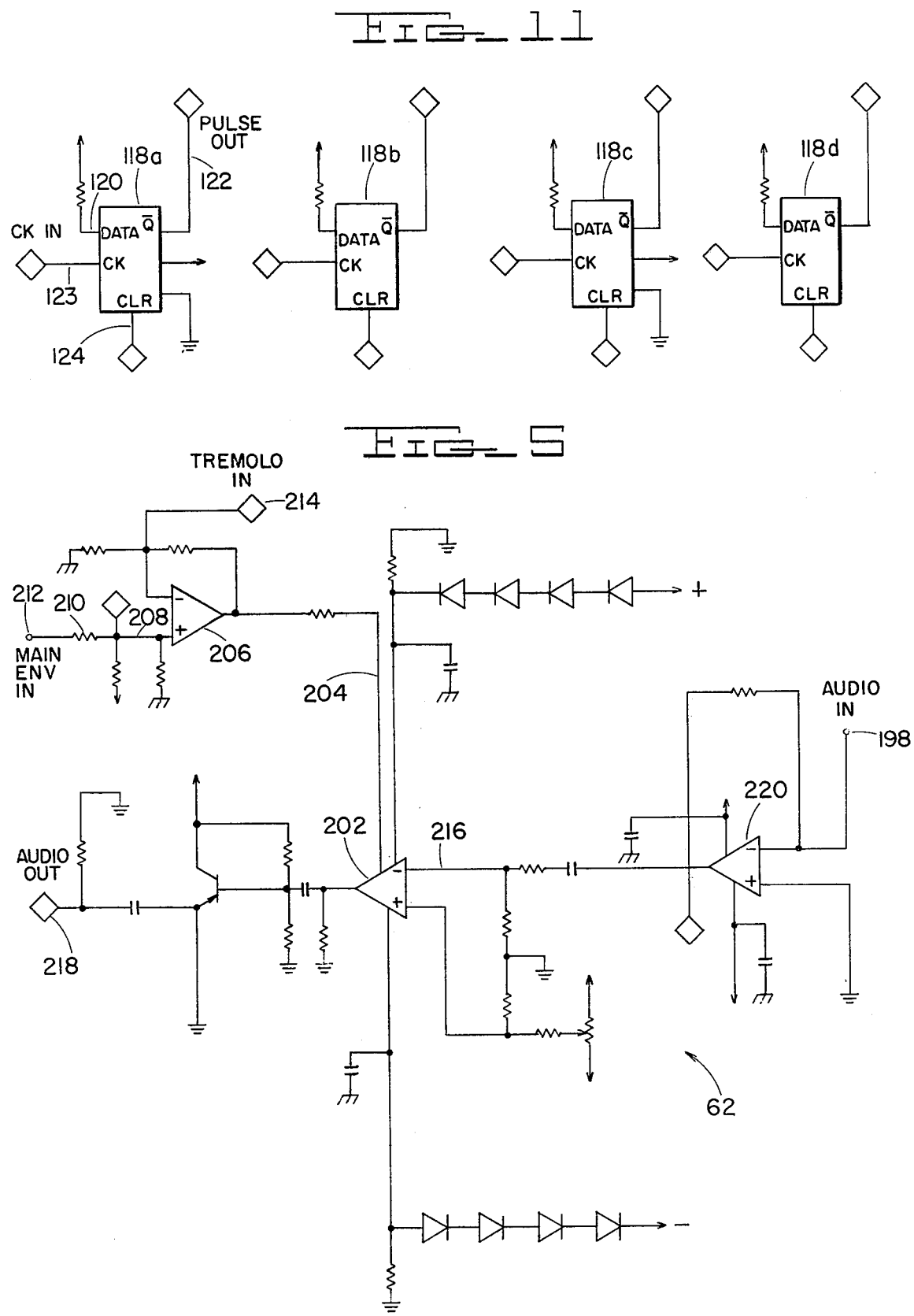

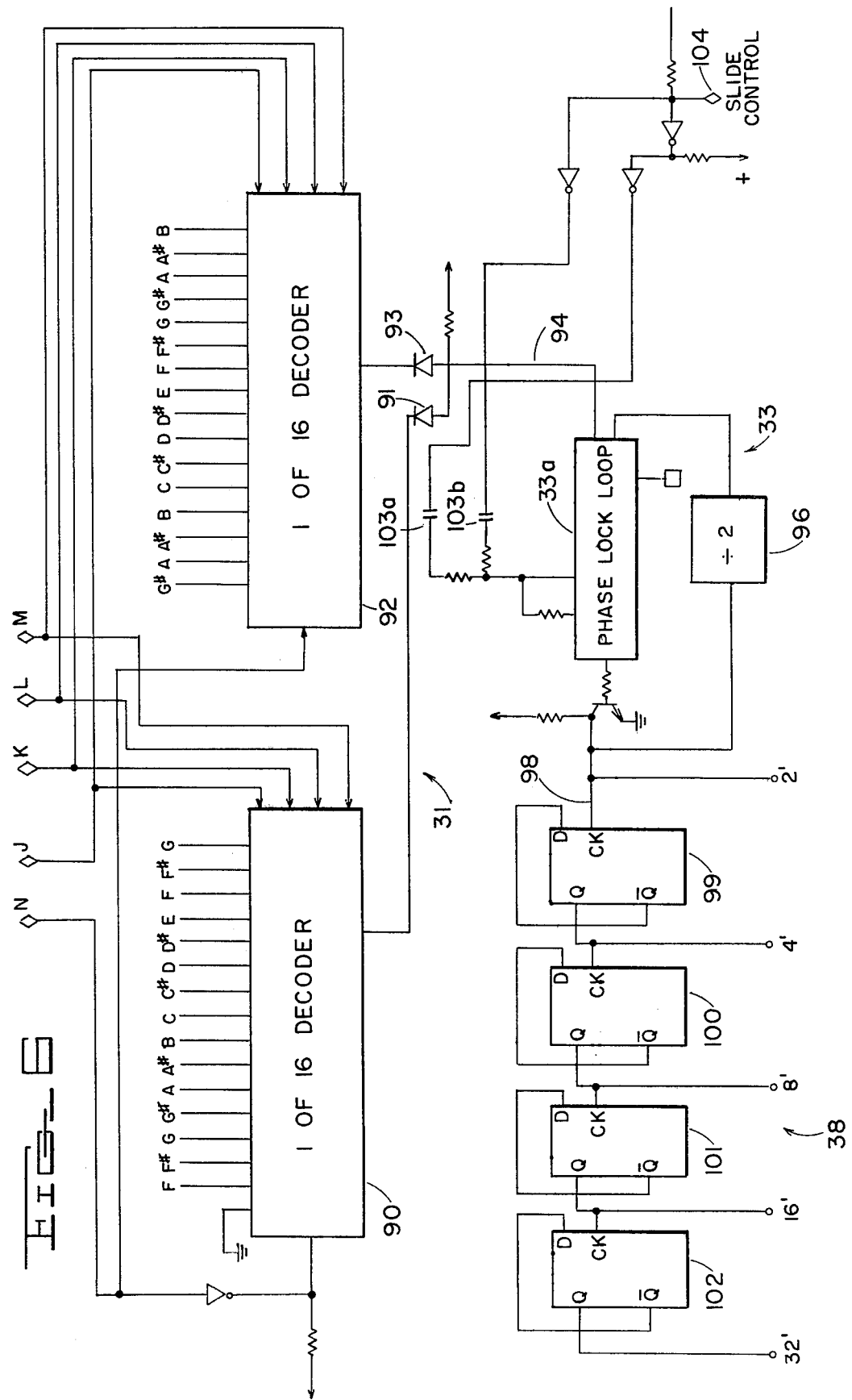

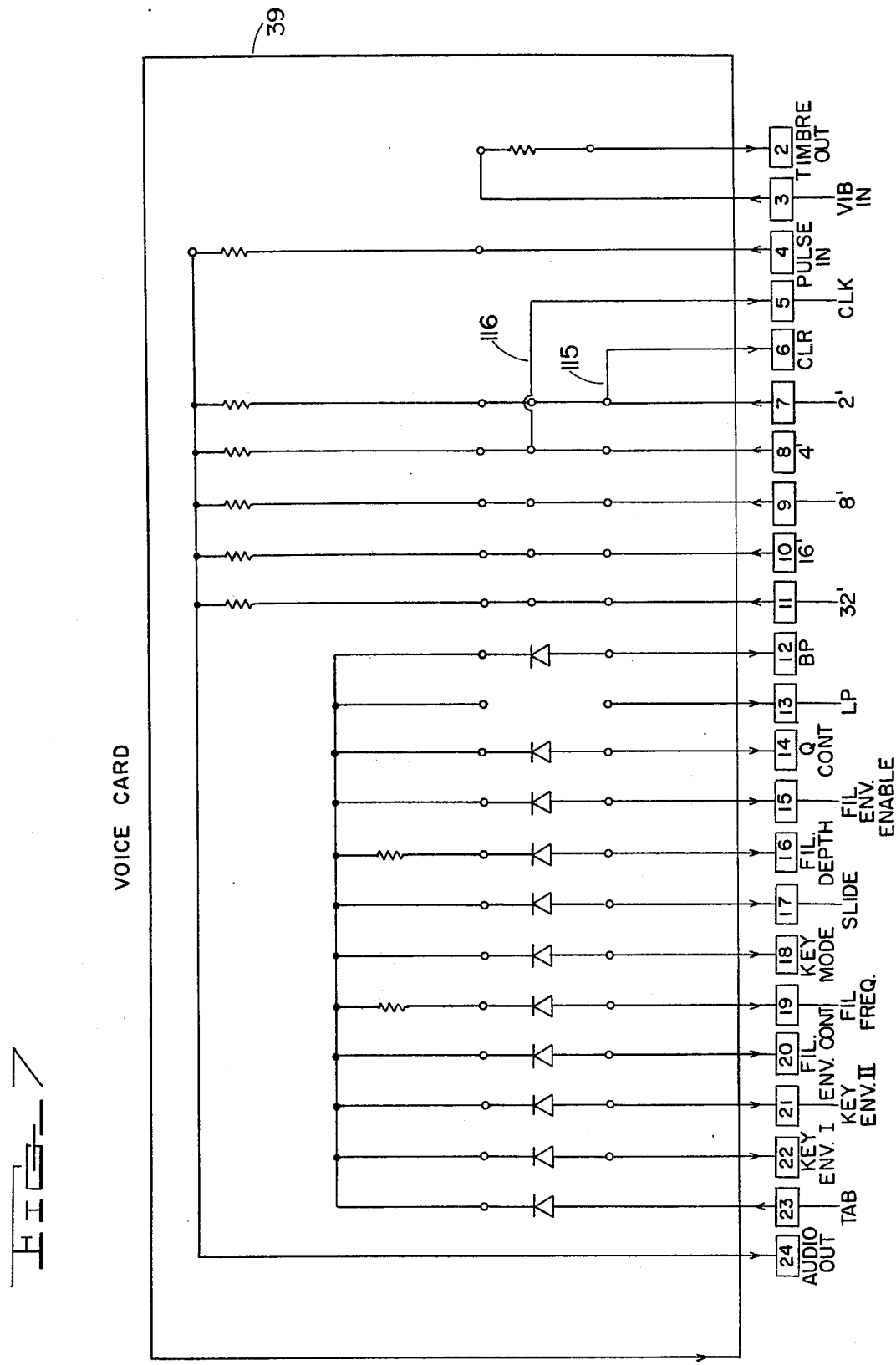

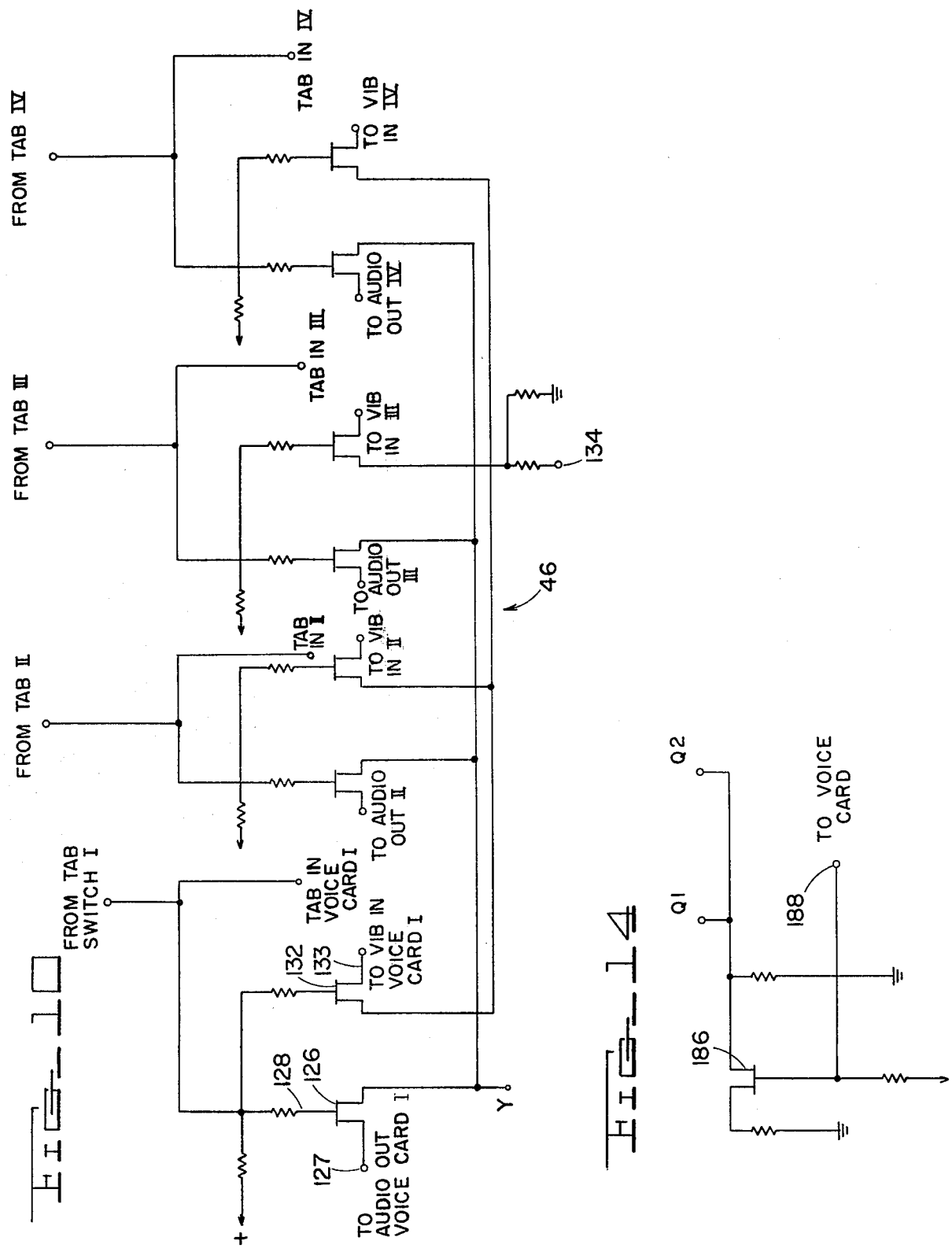

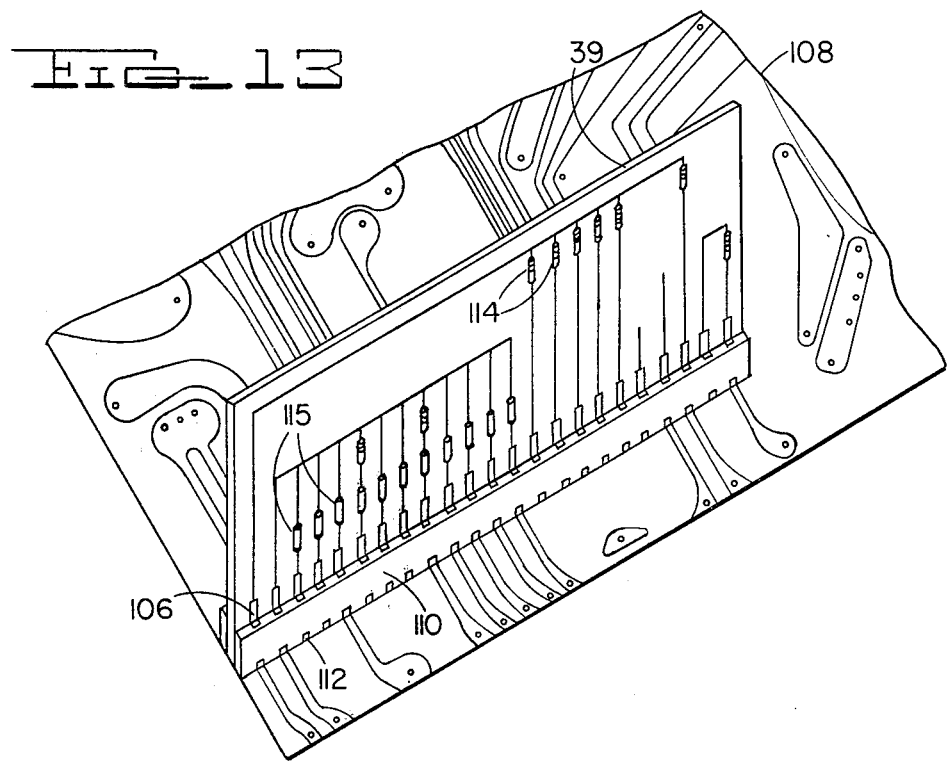

ELECTRONIC MUSIC SYNTHESIZER

BACKGROUND OF THE INVENTION

The present invention relates to an electronic music synthesizer, and in particular to a synthesizer which is capable of easy programming by the player.

Electronic music synthesizers which simulate musical effects, many of which are not producible by ordinary musical instruments, are well known and have been used extensively in modern music. Most synthesizers, however, are capable of being used effectively only by musicians having a rather sophisticated knowledge of audio electronics, because of the necessity for individually setting the various circuit parameters which are desired, by means of individual switches and potentiometers. Although such a synthesizer offers virtually unlimited flexibility in programming, and is therefore attractive to the serious student of music and audio electronics, it does not lend itself well to the majority of amateur musicians, who would like to play synthesized music but are not capable of making the individual settings which are necessary to achieve the desired sounds.

SUMMARY OF THE INVENTION

According to the present invention, all player programming for the synthesizer is reduced to a single circuit board, which may be resistor/diode programmed, and may be physically inserted in the circuit by the player, or a plurality of such circuit boards may be hard wired in the circuit and individually selected by tab switch operation.

A plurality of keys on a standard electronic organ select the tones which are processed by the synthesizer and are connected to a priority latching circuit which generates a five bit binary word at its output corresponding to the depressed key, or that key having priority if a plurality of keys are depressed. This word is held in a memory, and memory comparing circuitry initiates the delay before updating the memory to eliminate the effects of key bounce. The five bit word in the memory selects one of the tones from the organ tone generator and feeds this tone to a phase lock loop, which locks in on the frequency of the input tone and outputs a tone twice in frequency to that of the input. Portamento is achieved by controlling the speed at which the phase lock loop reacts to a new signal and is controlled by a binary input.

The tone from the phase lock loop is fed to a series of dividers to generate the footages and these are then fed to a voice card which provides combinations of the footages to produce an audio output signal in a pulse circuit fed thereby. The audio output signal is fed to the input of a biquadratic filter, which is controlled by a filter envelope which determines the filter depth, frequency, timbre, and frequency band dependent on the programming of the voice card. The frequency of the filter may be set either by fixing it at a particular frequency or by moving the filter frequency with the filter envelope so that dynamic frequency characteristics are achieved.

The amplitude envelope is controlled by a main envelope generator which selects one of four possible attack and decay combinations and a mode, such as steady state, percussive, transient or piano. Again, the main envelope is determined by the programming of the voice card. The output signal is then fed to the organ amplifier circuitry and from there to a speaker.

Specifically, the present invention contemplates a music synthesizer comprising: a tone generator for producing a plurality of tones, keyboard controlled means for selecting one of the tones when a key of the keyboard is actuated, programmable electronic circuit means for modifying the selected tone to produce a synthesized tone having predetermined static and dynamic frequency and amplitude characteristics when the key is actuated, and means for player programming the programmable means to set the characteristics. The programming may be achieved either by inserting a multiple element electronic circuit module in the programmable circuit, or by selecting one of a plurality of such circuit modules hard wired in the circuit.

By using preprogrammed voice cards, the synthesizer can be programmed to produce a virtually limitless range of sound effects without requiring sophisticated parameter studying on the part of the player. All that is necessary, is to select the desired sound effect and then either insert the corresponding card or render it operable by switching the corresponding tab switch.

BRIEF DESCRIPTION OF THE DRAWINGS

FIGS. 1A and 1B together form a block diagram for the synthesizer of the present invention;

FIG. 2 is a schematic of a portion of the synthesizer;

FIGS. 3A and 3B together form the main envelope generator and filter envelope generator for the synthesizer;

FIG. 4A is a schematic of the state variable active filter,

FIG. 4B is a schematic of the filter frequency control;

FIG. 5 is a schematic of the gain module;

FIG. 6 is a block diagram of the tone selection circuit for the synthesizer;

FIG. 7 is a diagrammatic representation of a voice card;

FIG. 10 is a schematic of the voice selector;

FIG. 11 is a schematic of a plurality of pulse generators for producing the audio input signal for the variable state active filter;

FIG. 13 is a perspective view of a voice card removeably inserted in the synthesizer; and FIG. 14 is a schematic of the programmable Q setting for the variable state active filter.

DETAILED DESCRIPTION

Figure 8:
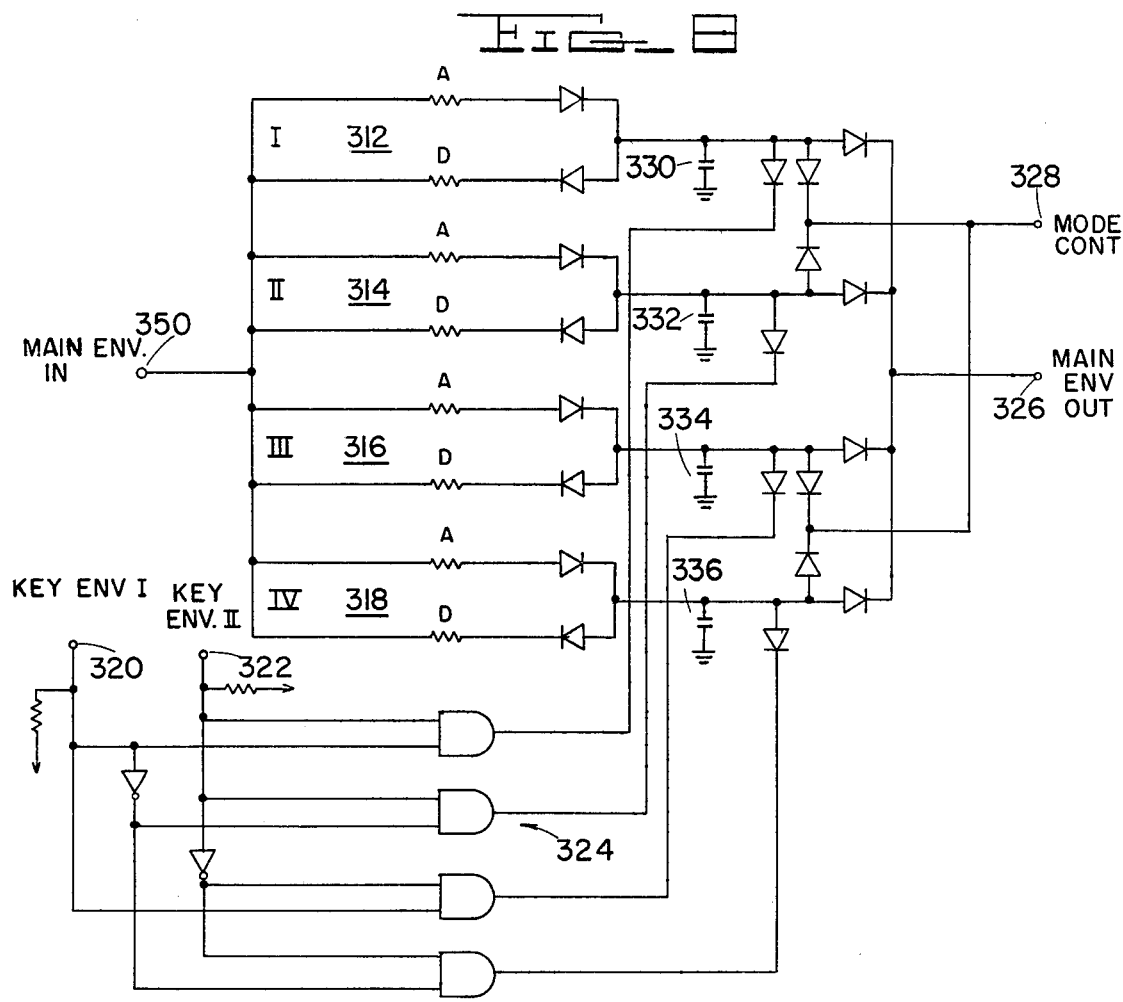
FIG. 8 is a schematic of the programmable attack and decay circuit for the main envelope generator.

Referring now to the drawings, and in particular to FIGS. 1A and 1B, the synthesizer will be described in detail. Keydown signals from keyboard 20, for example, thirty-one keys in number, are connected to priority latching circuitry 22, which presents a five bit word on line 23 to memory 24 corresponding to the depressed key on keyboard 20. This five bit word is also presented to one of the sets of inputs of memory comparator 26 which initiates the delay circuitry 28 for the purpose of key bounce elimination. After the prescribed delay, transient keydown detector 29 transmits a pulse over line 30 to update memory 24. The five bit word from memory 24 selects in tone selector 31 one of the thirty-one tones generated by tone generator 32, and this tone is fed to phase lock loop 33, which locks in on the frequency of the input tone and generates at its output 34 a tone twice in frequency of that of the input tone. Portamento is controlled at phase lock loop 33 by portamento selector 35 and portamento control 36. An optional vibrato oscillator 37 may also be provided.

The tone from phase lock loop 33 is fed through a series of dividers 38 to generate the desired footages, which are first buffered and then fed to a selected one of voice cards 39. A plurality of voice cards 39, having diverse programming to produce a variety of sound effects, may be provided together with appropriate circuitry for selecting the desired card 39. Pulse circuits 40 and 41 receive combinations of the footages to provide output pulses on lines 42 and 43, as described in detail in U.S. Pat. No. 3,992,973, which is incorporated herein by reference. Voicing circuits 44 and 45 provide the appropriate combinations of the footages and output pulse trains, as will be described in greater detail at a later point. FET voice selector 46 selects the audio output signal, depending on the settings of tab 47, and feeds this audio signal to the input 48 of bi-quad filter 49.

Steady state keydown detector 50 and transient keydown detector 29 initialize main envelope generator 51 and filter envelope generator 52. The filter envelope is controlled by the filter envelope enable 53, filter envelope selector 54 and the filter depth control on line 55 from voice card 39. The filter envelope from generator 52 together with the frequency set and timbre from voice card 39 control the filter frequency through filter frequency control 56. The filter frequency is set by fixing it at a particular frequency by the frequency set signal on line 57, by moving the filter frequency with the filter envelope generator, or by the timbre signal on line 58.

With the frequency of bi-quad filter 49 set and a source input received by it, the Q for the filter is selected by a signal from Q selector 59. By FET switching in circuit 60, one of the bands of operation (high pass, low pass or band pass) of filter 49 is chosen, and the flat filter selector 61 selects the modified filtered voice or source to the filter 49 and outputs this tone to the input of gain module 62. The control for gain module 62 is main envelope generator 51, which is controlled by main envelope selector 63 and main envelope mode selector 64, which in turn are controlled by diode/resistor programming on voice card 39. The programming may produce any one of four possible attack and decay combinations through main envelope selector 54, and main envelope mode selector 63 gives the transient or percussive modes. This envelope on line 65 controls the output of gain module 62, which provides its output signal to organ preamp 66.

The actuated tab 47 selects the vibrato in vibrato selectors 67 and 68, the voicing in selector 46 and a voice card tab line in voice card 39. Vibrato selectors 67 and 68 are fed by the organ vibrato 69, and provide inputs to voice cards 39.

Referring now to FIG. 2, priority latching circuit 22 comprises four 74148 priority encoders 70, 71, 72 and 73, which produce a signal at the inputs 74, 75, 76, 77 and 78 of memory 24, which is a 74174P latch, depending on which key of the keyboard 20 is depressed. The depressed key presents a logic zero to the appropriate input of priority encoders 70, 71, 72 and 73. The same five bit binary word is connected to the inputs of exclusive OR gates 80, which make up memory comparator circuitry 26. Comparator 26 initiates the delay circuitry 28 comprising monostables 81, 82 and 83, which then triggers transient keydown detector 29 to transmit an updating pulse over line 86 to the clock input of memory 24. The updating pulse transfers the five bit binary word at the inputs 74-78 of memory 24 to its outputs 88 as binary word NMLKJ.

Referring now to FIG. 6, of the five bit binary word NMLKJ is fed to the inputs of one-of-sixteen decoders 90 and 92, which make up tone selector 31, and are fed by the thirty-one tones corresponding to the thirty-one keys of the keyboard 20. The outputs from decoders 90 and 92 are anded together by diodes 91 and 93 and then fed to the input of phase lock loop 33a over line 94. The provision of divide by two divider 96 connected between the output and one of the inputs of phase lock loop 33a causes the output on line 98 to be twice that of the frequency of the input on line 94. This is used to allow a higher starting pitch in this system. The output from phase lock loop 33a is fed to a series of dividers 99, 100, 101 and 102, which produce the 2', 4', 8', 16' and 32' pitches.

Portamento is achieved by placing a logic one on input 104 for slow portamento and a logic zero on input 104 for fast portamento. This renders either capacitor 103a or capacitor 103b, which are of different values, effective in the phase lock loop circuit. The input to phase lock loop 33a, which is an RCA 4046, is over line 104, is connected to pins 13 and 9. Thus, portamento may be controlled by a digital signal on input 104 which lends itself well to preprogramming.

The outputs from dividers 99, 100, 101 and 102, which are preferably buffered by means of AND gates having their inputs tied together, are fed to pins 7, 8, 9, 10 and 11 of voice card 39, which is shown in detail in FIG. 7 and in an exemplary physical form in FIG. 13. Voice card 39 is a multiple pin input card on which the programming for the entire synthesizer can be accomplished simply by means of resistor/diode programming. In the form shown in FIG. 13, voice card 39 has a plurality of contacts 106 extending to one edge thereof so that contact can be made between it and printed circuit board 108 by means of a multiple spring clip connector 110, which has corresponding contacts 112 resiliently engaging contacts 106. Connected to the various contacts are resistors 114 and diodes 115 which operate to set the various digital and analog levels in the synthesizer to achieve the desired sound effect. Card 39 is removable and interchangeable so that the programming for the synthesizer can be reduced to a plurality of such cards which may be selected and inserted by the user at will. Alternatively voice cards 39 could be hard wired into the system and selected by means of tab switches or the like, if less flexibility in programming is desired. The manner in which voice cards 39 interact with the remainder of the circuitry will be described in greater detail hereinafter.

Selected pairs of the footages on pins 7-11 of voice card 39 are connected to the clock and clear pins 5 and 6, respectively, by jumpers 115 and 116 which are connected to the clock and clear inputs of flip-flop 118a (FIG. 11). Similar flip-flops 118b, 118c and 118d are provided for each additional voice card 39. The operation of such a flip-flop, which is of the D-type, is described in detail in U.S. Pat. No. 3,992,973. Basically, a static level at the data input 120 is transferred to output 122 in conformity with the supply to the clock input 123 of a first fixed frequency rectangular wave and the supply to the clear input 124 of a rectangular wave having a frequency which is a whole number multiple of the frequency at the clock input 123. The pulse at the output has a duty cycle of predetermined length, depending upon the relationship between the respective signals and inputs 123 and 124. The signal on output line 122 is connected to the pulse in pin 4 of voice card 39 and transferred together with selected mixtures of other footages to the audio out pin 24 thereof.

Referring now to FIG. 10, there is shown four FET selectors which make up voice selector 46, there being a separate FET selector for each voice card 39 which the system can handle simultaneously for selection by the player. Each selector comprises a first FET 126 having its input 127 connected to the audio outpin 24 of voice card 39. The control terminal 128 is connected to a tab switch 130 (FIG. 12) which enables the audio output of that particular voice card 39. The second FET 132 has its output 133 connected to the vibrato in pin 3 of voice card 39. The input for FET 132 is a common input 134 which is connected to the vibrato board for the organ.

With reference now to FIG. 4A, the Y output of FET 126 is fed to the audio in input of bi-quadratic filter 49. Filter 49 is typified by a standard biquadratic or state variable active filter such as the Beckman Model 881 Universal Active Filter. A suitable filter is also disclosed in U.S. patent application Ser. No. 688,565 filed May 21, 1976, now U.S. Pat. No. 4,106,384, and owned by the assignee herein. Filter 49 comprises a plurality of operational amplifiers 136, 137 and 138, wherein the output of amplifier 136 is connected to FET 140, which forms the switching gate between amplifier 136 and the high pass line 142 and is controlled by the logic level on terminal 143. Similarly, the output of operational amplifier 137 is connected through switching FET 144 to the bandpass line 146 depending on the logic level on terminal 147, and the output of operational amplifier 138 is connected through switching FET 148 to the low pass line 150 and is controlled by the logic level on terminal 151.

The frequency characteristics of filter 49 are controlled by light dependent resistors 152 and 154 which are connected between the output of amplifier 136 and the input of amplifier 137, and between the output of amplifier 137 and the input of amplifier 138, respectively. Light dependent resistor 152 controls the center frequency of the part of the filter formed by amplifier 137, and light dependent resistor 154 controls the roll off frequency of the part of the filter formed by amplifier 138. Capacitor 155 and resistor 156 provide for feedback from the output of amplifier 138 to its input, capacitor 157 and resistor 158 provide for feedback between the output and input of amplifier 137, resistor 160 is the feedback path between the output and input of amplifier 136, and resistor 162 provides feedback from the output of amplifier 138 to the input of amplifier 136. By virtue of this arrangement as the frequency characteristics of amplifiers 137 and 138 are changed, so are the characteristics of amplifier 136. The high pass, band pass and low pass outputs 142, 146 and 150, respectively, are connected together on a common buss 164, which is connected to the drain of FET 166.

Light emitting diodes 152 and 154 are optically coupled to LED's 167 and 168, respectively, wherein the intensity of the light produced thereby is controlled by operational amplifiers 170 and 172. The output voltage of amplifier 170 is controlled by the voltage on timbre in terminal 174. Referring to FIG. 4B, the filter frequency control 56 has an input 176 from filter envelope generator 52, a filter depth input 178 from pin 16 of voice card 39, a filter frequency input 180 from pin 19 of voice card 39, and a timbre input 182 from pin 2 of voice card 39. Terminal 182 is connected to terminal 174 of filter 49.

The Q of filter 49 is an external control fed into amplifier 136 from potentiometer 184, which may either be a true potentiometer or an electronically set attenuator. FIG. 14 illustrates appropriate circuitry for externally programming the filter Q and comprises an FET 186 having a control terminal 188 connected to pin 14 of voice card 39.

Filter 49 may be completely bypassed by turning on FET 190 with an appropriate voltage level on terminal 192 and turning off FET 166. This will cause the output of amplifier 194 to pass along bypass line 196 directly to the input 198 of gain module 162. This may be preprogrammed by providing a pair of additional terminals on voice card 39 connected to terminals 192 and 200.

Filter 49 is that portion of the synthesizer which sets the dynamic and static frequency characteristics of the sound. The filter envelope together with the frequency set and the timbre control the filter frequency. The filter frequency control sets the frequency of the filter, either by fixing it at a particular frequency by the frequency set, or by moving the frequency of the filter with the filter envelope generator so that dynamic frequency characteristics are obtained.

Referring now to FIG. 5, gain module 62 will be described. It comprises a variable transconductance amplifier 202 having its control input 204 connected to the output of amplifier 206. The non-inverting input 208 is connected through resistor 210 to main envelope in terminal 212. Its inverting input is connected to the tremolo in input 214, at which point tremolo is brought in from the organ. As will be described in greater detail hereinafter, when a key is depressed, an enabling voltage is transmitted to control input 204 for transconductance amplifier 202 thereby permitting the audio signal on inverting input 216 to be passed to the audio out output 218, which is connected to the organ preamp 66.

The audio signal to gain module 62 is brought in from filter 49 over terminal 198 connected to the source terminal of FET 166. The output of amplifier 220 is RC coupled to the input of amplifier 202.

With reference to FIGS. 3A and 3B, the main envelope generation will be described. The system is capable of operation in one of four modes as selected by a two bit binary word on terminals 222 and 224. When binary 00 is placed on terminals 222 and 224, the system will operate in the piano mode having an attack and decay to simulate a piano sound. When binary 01 is placed on terminals 222 and 224, the system will operate in the percussion mode which renders a pizzicato effect when the key is released during decay. Binary 10 will produce steady state operation at a gain level which remains constant while the key is depressed and will decay when the key is released. Binary 11 places the system in the transient mode, which is similar to steady state except that the rapid decay of the first sound when a second key is depressed is disabled.

Discussing first the steady state mode, when the steady state keydown signal comes in on terminal 226, which is connected to flip-flop 50 in FIG. 2, it feeds through inverter 228 to NOR gate 230. Gate 230 is enabled by a logic 0 at the output of gate 232, which allows control of the gate to be handled solely by the signal on terminal 226, which goes from logic 0 to logic 1 when a key is depressed. As indicated above, this condition is achieved by logic 1 0 being placed on terminals 222 and 224.

When a key is not depressed, the output 234 of NOR gate 230 is at logic 0 which in turn goes through voltage follower 236 and provides a zero volt signal on capacitor 238, which is sent through non-inverting amplifier 240 to main envelope out terminal 242. Terminal 242 is connected to terminal 212 in FIG. 5 and the voltage thereon is connected to the non-inverting input of amplifier 206. The output of amplifier 206 disables variable transconductance amplifier 202 so that the audio input on terminal 198 will not be passed to audio out terminal 218.

When a key is depressed, the logic 1 signal from NOR gate 230 goes through voltage follower 236 and charges capacitor 238 to a predetermined level. The voltage on capacitor 238 is transferred to amplifier 202 in the manner described above thereby enabling it to pass the audio signal on input terminal 198 to the audio out terminal 218. The attack for the system is set by resistor 244 by virtue of diode 246. When the key is released, the decay is set by resistor 248 by virtue of diode 250. As will be described hereinafter, the attack and decay produced by the circuitry in block 252 may be programmed by the circuitry shown in FIG. 8.

One characteristic of the steady state mode is that if another key is depressed, while a key is being held, the decay will be very rapid. This is accomplished by the $\bar{P}$ pulse on terminal 252 which originates at monostable 29 in FIG. 2. This pulse is fed to NOR gate 254 which allows a very rapid discharge of capacitor 238 via resistor 256 and open collector device 258.

The transient mode, which is attained by placing binary 11 on terminals 222 and 224, is very similar to the steady state mode except that the rapid discharge feature just described is disabled. This is accomplished by means of input 262 of OR gate 264, which is connected to terminal 224 through diode 266, thereby disabling this pulsing system.

In the piano mode with binary 00 on terminals 222 and 224, NAND gate 254 is disabled unless there is a pulse, in which case it functions as before. NOR gate 268 is now enabled, allowing the snub feature to become activated, thereby producing the characteristic piano sound. NOR gate 270 has logic 0 on its output which enables NOR gate 232 with a logic 1 on its input since flip-flop 272 is set such that pin 274 is logic 0 and pin 276 is logic 1. This gives control of voltage follower 236 to the steady state keydown detector via the logic 0 on pin 278 of NOR gate 230.

When the key was depressed, terminal 226 goes from logic 0 to logic 1 and the output of NOR gate 230 goes to logic 1 and the circuitry involved with NOR gate 268 is released so that open collector device 280 goes open thereby removing the circuitry from capacitor 238. The voltage from voltage follower 236 is fed to capacitor 238, as before. On the output of voltage follower 236, however, which is a non-inverting amplifier, comparator 282 comes into play. When the voltage on amplifier 240 has reached the bias voltage of zener diode 283, comparator 282 activates thereby resetting flip-flop 272. When this happens, pin 284 of NOR gate 232 is activated which removes control of gate 230 from the steady state keydown signal on terminal 226 and initiates the decay cycle. As long as the key is depressed, the circuit will decay out and remain quiescent. If, however, during the decay process the steady state keydown detector 50 is released, indicating that a key has been released, NOR gate 268 comes into effect by saturating open collector device 280 and discharging capacitor 238 very rapidly thereby giving a snub effect to the tone which is characteristic of a piano sound.

The percussion mode, in which binary 01 is present on terminal 222 and 224, works similarly to the piano mode with the exception of the decay when a key is released during normal decay. In this mode, open collector device 258 causes a much more rapid decay thereby giving a percussion or pizzicato effect.

As discussed previously, the main envelope signal appears on terminal 242 and controls variable transconductance amplifier 202 in FIG. 5.

The percussion envelope generator 52 shown in FIG. 3B works similarly to the main envelope generator 51 except that it does not have a steady state mode. The steady state keydown signal comes into circuit 52 over line 286 to one of the inputs of OR gate 288 through inverter 290. OR gate 288 is enabled by the binary signal on filter envelope enable terminal 292, which is connected to pin 15 of voice card 39. When a steady state keydown signal appears on line 286, the voltage at the output of OR gate 288 is passed through voltage follower 294 and charge capacitor 296, with the rate of attack being determined by resistor 298. This voltage passes through non-inverting amplifier 302 and appears on filter frequency envelope terminal 304.

When the voltage at the output of amplifier 302 reaches the predetermined peak level, according to zener diode 283, comparator 304 will reset flip-flop 306 thereby disabling OR gate 288 and causing capacitor 296 to discharge through resistor 308 into voltage follower 294. Thus, the decay characteristics are determined by resistor 308, which is of a different value than attack resistor 298.

The filter envelope on terminal 304 is fed through the timbre circuitry of FIG. 4B and controls biquadratic filter 49.

Figure 9:
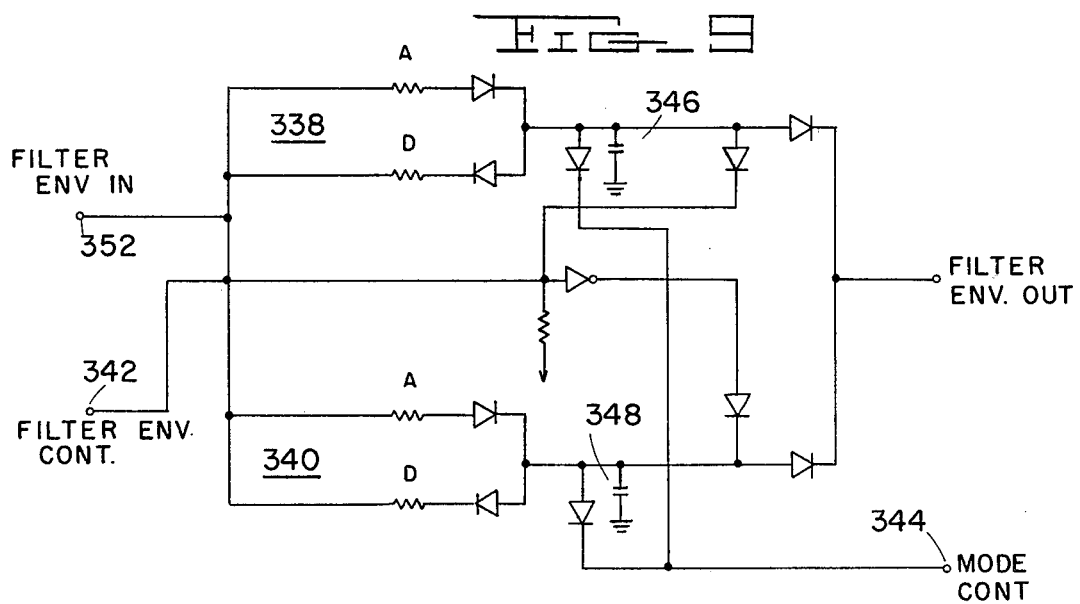
FIG. 9 is a schematic of the programmable attack and decay circuit for the filter envelope generator.

As mentioned earlier, the attack and decay for main envelope generator 51 and filter envelope generator 52 may be programmed by the circuitry shown in FIGS. 8 and 9, respectively. Referring first to FIG. 8, four attack and decay circuits 312, 314, 316 and 318 are shown, one of which is selected by the two bit binary word on terminals 320 and 322. The decoding of this binary word is accomplished by decoding logic 324. The main envelope output signal appears on terminal 326. Mode control terminal 328, which is connected to terminal 18 of voice card 39, clamps capacitors 330, 332, 334 and 336 when a new key is depressed in the transient and percussive modes. Terminals 320 and 322 may be programmed by providing an appropriate number of terminals, such as terminal 22, on voice card 39.

The circuitry in FIG. 9 provides the programming for the filter envelope attack and decay circuitry. Two such attack and decay circuits 338 and 340 are shown, one of which is selected depending on the binary signal on filter envelope control terminal 342. Terminal 342 is connected to terminal 20 of voice card 39 so that it may be preprogrammed. Mode control terminal 344, which is also capable of being programmed, clamps capacitors 346 and 348 in the transient and percussive modes.

Thus, four different attack and decay characteristics may be selected for the main envelope signal on terminal 350 by appropriately programming terminals 320 and 322. In the system shown, two separate sets of attack and decay characteristics for the filter envelope signal on terminal 352 may be selected by programming terminal 342. The circuits shown in FIGS. 8 and 9 may be substituted for blocks 252 and 354 in FIGS. 3A and 3B, respectively.

Figure 12:
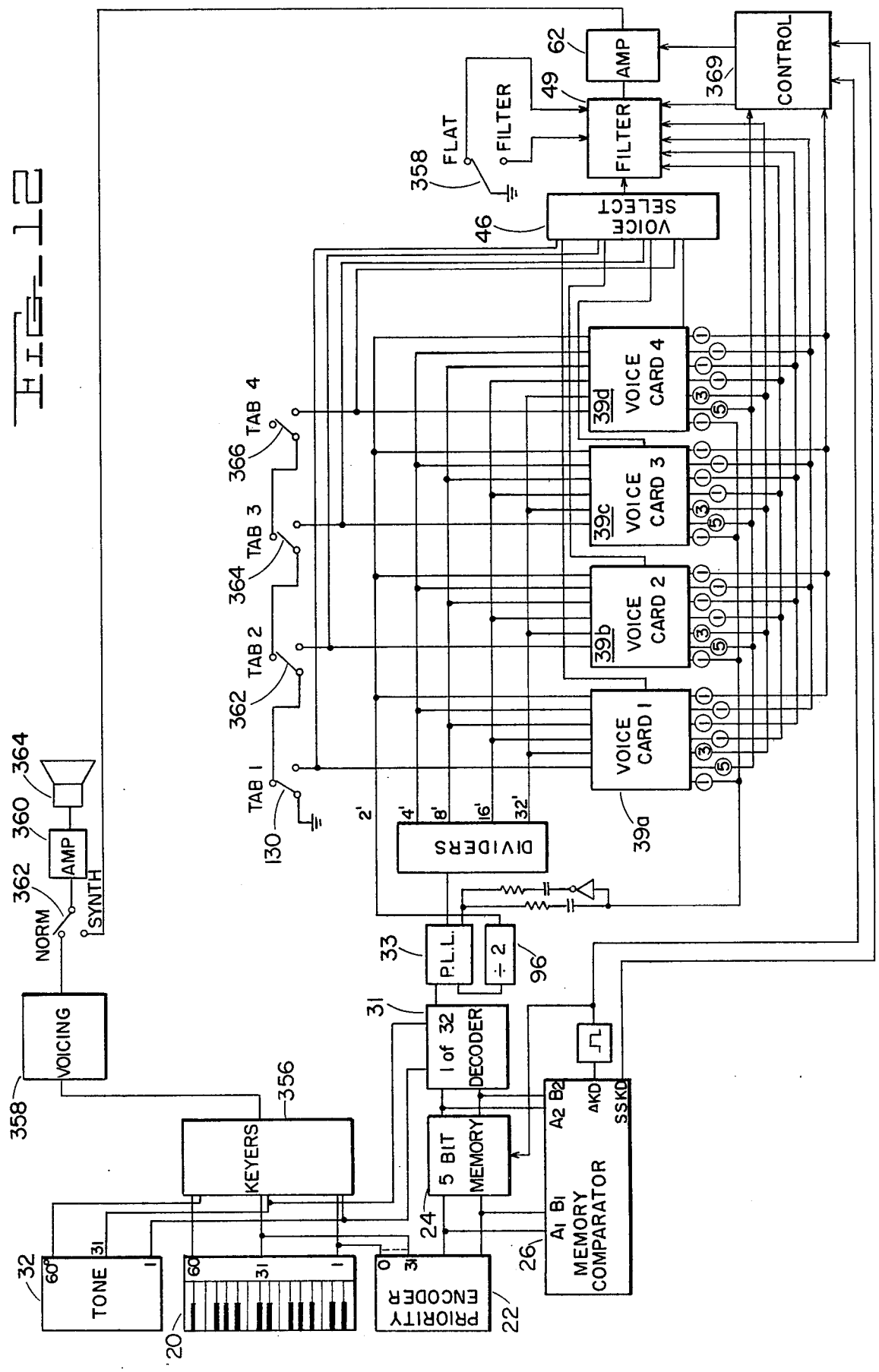
FIG. 12 is a simplified block diagram of the synthesizer showing a plurality of voice cards selectable by tab switches.

FIG. 12 illustrates an exemplary form of the synthesizer in simplified block diagram form wherein four voice cards 39A, 39B, 39C and 39D are provided. Wherever possible, the same reference numerals have been used for elements common with the system of FIGS. 1A and 1B. Keyers 356 are connected between keyboard 20 and tone generator 32 and have outputs connected to voicing circuit 358. Power amplifier 360 has its input connected through normal/synthesizer switch 362 to the output of voicing circuit 358 and has an output to speaker 364. Priority encoder 22 encodes keys 1 through 31 and provides a five bit word to five bit memory 24. The tones from tone generator 32 are fed to one input of one-of-thirty-two decoder 31 which selects one of the tones depending on the five bit word provided at the output of memory 24. Memory comparator 26 provides for key switch bounce elimination.

The output of decoder 31 is connected to phase lock loop 33 which provides 2', 4', 8', 16' and 32' tones to voice cards 39a, 39b, 39c and 39d. The output of voice select circuit 46 passes through biquadratic filter 49 and gain module 62 from which it passes through switch 362 to power amplifier 360 and speaker 364. Filter 49 may be bypassed by switching switch 358 to the "FLAT" position. Control 360 represents the circuitry for the main envelope and filter frequency envelope control.

In this case, four permanently wired voice cards 39a–39d are provided and are selectively enabled by tab switches 130, 362, 364 and 366, which are connected to the control circuit of FIG. 10. As discussed previously, rather than hard wiring voice cards 39, an arrangement such as that shown in FIG. 13 may be provided whereby any one of a large number of such cards 39 may be inserted manually by the player. Alternatively, a plurality of such cards could be removeably inserted by the player and then selected during playing by actuating the appropriate tab switch 130, 362, 364 and 366. Instead of voice cards 39, manual switches and potentiometers could be utilized to provide an infinite degree of adjustment for the player, in cases where maximum programming flexibility is desired. For those players whose knowledge of audio electronics is more limited, preprogramming by means of voice cards 39 could be provided.

The arrangement of the synthesizer described herein, wherein the programming values are collected in an easily identifiable and readily accessed manner, affords maximum flexibility both from a manufacturing standpoint and ease of use by the player in achieving a wide variety of synthesized sound.

While this invention has been described as having a preferred design, it will be understood that it is capable of further modification. This application, is therefore, intended to cover any variations, uses, or adaptations of the invention following the general principles thereof and including such departures from the present disclosure as come within known or customary practice in the art to which this invention pertains and fall within the limits of the appended claims.

What is claimed is:

1. A music synthesizer comprising:

tone generator means for producing a plurality of tones, keyboard controlled means for selecting one of said tones when a key of said keyboard is actuated, footage generating means connected to said tone generator means for generating a plurality of tones octavely related to said selected tone, a connector element having a plurality of output terminals and at least one input terminal, said footage generating means placing said tones generated thereby respectively on said connector element terminals, a multiple element programmable electronic circuit module removably connected to said connector element and having a plurality of input terminals which contact the output terminals of said connector element and an output terminal which contacts the input terminal of said connector element when said module is connected thereto, a resistive circuit means on said module connected to the terminals of said module for resistively summing the octavely related tones to produce a composite tone having a particular wave shape on the output terminal of said module, and programmable circuit means connected to said connector element input terminal for modifying said composite tone to produce a synthesized tone having predetermined static and dynamic frequency and amplitude characteristics.

2. The synthesizer of claim 1 wherein said programmable circuit means includes a plurality of control input terminals connected via said connector element to other circuit control elements on said programmable module.

3. The synthesizer of claim 1 including a programmable duty cycle generator comprising: a flip-flop having a data input having a predetermined logic level thereon, a clock input, a clear input, and an output terminal, and wherein said programmable module has an output connected to said clock input via said connector element and connected to one of said module input terminals via a conductor on said module, and said programmable module further has an output connected to said clear input via said connector element and connected to another of said module input terminals via a second conductor on said module, said tones on said one and another of said module input terminals are square waves, and the tone on said another input terminal is a whole number multiple of the tone on said one input terminal.

4. The synthesizer of claim 2 including a plurality of said connector elements and a plurality of said programmable modules each removably connected to its respective said connector element and including switch means for selecting only one of said modules to be operative in said synthesizer.

5. The synthesizer of claim 2 wherein said programmable circuit means comprises:

amplitude envelope generator means for receiving said selected tone and imparting to said selected tone an amplitude envelope having predetermined attack and decay characteristics, filter envelope generator means for generating a filter control signal having a predetermined time varying envelope, and active filter means for receiving said selected tone and imparting to said selected tone frequency characteristics in accordance with said filter control signal.

6. The synthesizer of claim 2 wherein said programmable circuit means includes means for imparting to said synthesized tone an amplitude envelope and a frequency envelope each having time function attack and decay characteristics selected by said programmable module.

7. The synthesizer of claim 6 wherein said programmable circuit means is operable in a steady state mode wherein said amplitude envelope sustains as long as the key is depressed, and in a percussive mode wherein said amplitude envelope decays automatically after a predetermined period of time, said programmable circuit means being programmed in one of said modes by said programmable module.

8. The synthesizer of claim 2 wherein said programmable circuit means imparts voicing to said synthesized tone, said voicing being selected by said programmable module.

9. The synthesizer of claim 2 wherein said programmable module comprises a circuit card having interconnected discrete circuit elements carried thereby and a plurality of contacts, said connector element making resilient electrical contact with said plurality of contacts so as to connect said card in circuit.

10. The synthesizer of claim 9 wherein said contacts are located on the edge of said card and said connector element is an edge connector.

11. The synthesizer of claim 9 wherein said card is programmed by diodes and resistors on said card.

12. The synthesizer of claim 5 wherein said active filter means comprises a state variable filter and said module selects the timbre and frequency band for said filter.

13. The synthesizer of claim 5 wherein said module sets the Q and filter depth of said state variable filter.

14. The synthesizer of claim 5 wherein said module sets the attack and decay characteristics for said amplitude and filter envelopes.

15. The synthesizer of claim 5 including priority means for selecting only one of the tones corresponding to a plurality of actuated keys on said keyboard so as to convert from polyphonic to monophonic operation.

16. The synthesizer of claim 5 including a phase lock loop having an input and an output for receiving said selected tone and means controlling the reaction rate of said phase lock loop to impart portamento to said tone.

17. The synthesizer of claim 16 including frequency divider means connected between the output and input of said phase lock loop for increasing the frequency of the tone at the output thereof.

18. The synthesizer of claim 5 including:
means for decoding said keyboard to produce a binary word, memory means having an input and an output and receiving said word at its input, comparing means for comparing the data at the input of said memory means with the data at the output thereof, and memory update means for transferring the binary word at the input of said memory means to the output thereof after a given delay when a new key is actuated.

19. A music synthesizer comprising:
tone generator means for producing a plurality of tones,
keyboard control means for selecting one of said tones when a key of said keyboard is actuated,
programmable electronic circuit means for modifying said selected tone to produce a synthesized tone having predetermined static and dynamic frequency characteristics when said one key is depressed,
attack and decay means for imparting to said synthesized tone at any time one of a plurality of possible amplitude envelopes each having a characteristic time function attack portion and a characteristic time function decay portion, said attack and decay means including a binary controlled selector means including a plurality of control lines for selecting one of said possible amplitude envelopes under the control of a parallel format multiple bit binary word on said control lines, there being less control lines than said possible amplitude envelopes, and a respective bit of said word being on each of said lines,
said selector means including a connector element having contacts connected respectively to said control lines, and
a programmed electronic circuit module means removably connectable to said connector element for placing on said contacts said binary word.

20. The synthesizer of claim 19 wherein said attack and decay means comprises a plurality of resistor-capacitor timing circuits individually selected by said selector means under the control of said binary word.

21. The synthesizer of claim 20 including four resistor-capacitor timing circuits and four control lines, and wherein said binary word is a two bit binary word.

22. The synthesizer of claim 19 wherein said attack and decay means is operable in a steady state mode wherein said amplitude envelope sustains as long as the key is actuated and in a percussive mode wherein said amplitude envelope decays automatically after a predetermined period of time, said attack and decay means being programmed in one of said modes by said module means.

23. The synthesizer of claim 19 wherein said programmable circuit means imparts voicing to said synthesized tone, said voicing being selected by said module means.

* * * * *